(12) United States Patent
Yokoyama et al.

(10) Patent No.: US 10,979,047 B2
(45) Date of Patent: Apr. 13, 2021

(54) TOUCH PANEL SWITCH DEVICE

(71) Applicant: Futaba Corporation, Mobara (JP)

(72) Inventors: Masaru Yokoyama, Mobara (JP);
Yasuo Ono, Mobara (JP); Yosuke Kanno, Mobara (JP)

(73) Assignee: Futaba Corporation, Mobara (JP)

( * ) Notice: Subject to any disclaimer, the term of this patent is extended or adjusted under 35 U.S.C. 154(b) by 64 days.

(21) Appl. No.: 16/059,540

(22) Filed: Aug. 9, 2018

(65) Prior Publication Data

US 2019/0052265 A1 Feb. 14, 2019

(30) Foreign Application Priority Data

Aug. 9, 2017 (JP) .............................. JP2017-154300

(51) Int. Cl.
*H03K 17/96* (2006.01)
*G06F 3/0488* (2013.01)
(Continued)

(52) U.S. Cl.
CPC ............. *H03K 17/96* (2013.01); *B60K 35/00* (2013.01); *B60K 37/06* (2013.01); *G06F 3/0482* (2013.01);
(Continued)

(58) Field of Classification Search
CPC .... G06F 3/041; G06F 3/0416; G06F 3/04162; G06F 3/048; G06F 3/0481;
(Continued)

(56) References Cited

U.S. PATENT DOCUMENTS

2010/0127847 A1* 5/2010 Evans ................. G06F 3/04817
340/461
2014/0203999 A1* 7/2014 Shim ................... G06F 3/04817
345/2.2
(Continued)

FOREIGN PATENT DOCUMENTS

JP 2000344027 A 12/2000
JP 2001306330 A 11/2001
(Continued)

OTHER PUBLICATIONS

Japan Patent Office, Notice of Reasons for Refusal, Application No. 2017-154300, dated Sep. 27, 2019, 6 pages.

*Primary Examiner* — Nathan Danielsen
(74) *Attorney, Agent, or Firm* — Quarles & Brady LLP

(57) ABSTRACT

A touch panel switch device includes a display panel, a touch panel placed correspondingly to the display panel, a storage part and a control part. The storage part stores switch image information according to respective operation functions, code information according to the respective operation functions and placement information for display designating placement of switch images to be displayed on the display panel. The control part is configured to make the display panel display the switch images according to the switch image information and the placement information for display, and, in accordance with a touch operation onto the touch panel, read out from the storage part the code information corresponding to the switch image displayed at a location of the touch operation, perform output control of the code information, and also perform a rewrite process of the placement information for display based on received information.

6 Claims, 15 Drawing Sheets

(51) Int. Cl.
    *G06F 3/0482* (2013.01)
    *B60K 37/06* (2006.01)
    *B60K 35/00* (2006.01)
    *G06F 3/0481* (2013.01)
    *B60R 11/00* (2006.01)
    *G06F 3/0483* (2013.01)

(52) U.S. Cl.
    CPC ...... *G06F 3/04817* (2013.01); *G06F 3/04886* (2013.01); *B60K 2370/1438* (2019.05); *B60K 2370/1442* (2019.05); *B60K 2370/151* (2019.05); *B60R 2011/001* (2013.01); *G06F 3/0483* (2013.01); *H03K 17/9618* (2013.01); *H03K 2217/96046* (2013.01)

(58) Field of Classification Search
    CPC ..... G06F 3/04817–0483; G06F 3/0487; G06F 3/0488; G06F 3/04886; H03K 17/96; H03K 17/9618–9622; H03K 2217/96042; H03K 2217/96046; H03K 2217/960785–960795; B60R 2011/001; B60K 35/00; B60K 37/00–06; B60K 2370/143–145; B60K 2370/151; B60K 2370/1515

See application file for complete search history.

(56) References Cited

U.S. PATENT DOCUMENTS

| | | | |
|---|---|---|---|
| 2014/0298243 A1* | 10/2014 | Le | G06F 16/248 |
| | | | 715/780 |
| 2014/0365120 A1* | 12/2014 | Vulcano | G01C 21/265 |
| | | | 701/532 |
| 2015/0205558 A1* | 7/2015 | Oike | G06F 3/048 |
| | | | 358/1.15 |
| 2017/0061669 A1 | 3/2017 | Hirano et al. | |

FOREIGN PATENT DOCUMENTS

| | | |
|---|---|---|
| JP | 2006012262 A | 1/2006 |
| JP | 2013084187 A | 5/2013 |
| JP | 2016143233 A | 8/2016 |
| JP | 2017-47782 | 3/2017 |
| JP | 2017-56860 | 3/2017 |

\* cited by examiner

FIG.4A

SWITCH IMAGE TABLE

| SWITCH ID | SWITCH IMAGE |
|---|---|
| SW1 | ... |
| SW2 | ... |
| SW3 | ... |
| ⋮ | ⋮ |

FIG.4B

BACKGROUND TABLE

| BACKGROUND ID | BACKGROUND IMAGE PATTERN |
|---|---|
| BS1 | ... |
| BS2 | ... |
| BS3 | ... |
| ⋮ | ⋮ |

FIG.4C

SWITCH FUNCTION TABLE

| SWITCH ID | OPERATION CODE |
|---|---|
| SW1 | CSW1 |
| SW2 | CSW2 |
| SW3 | CSW3 |
| ⋮ | ⋮ |

LAYOUT TABLE
| LAYOUT ID | NUMBER OF SWITCHES | NUMBER OF PAGES | LAYOUT INFORMATION |
|---|---|---|---|
| L Y 1 | 6 | 1 | ... |
| L Y 2 | 5 | 1 | ... |
| L Y 3 | 1 2 | 2 | ... |
| . | . | . | . |
| . | . | . | . |
| . | . | . | . |
FIG.5A
LY1  LAYOUT INFORMATION
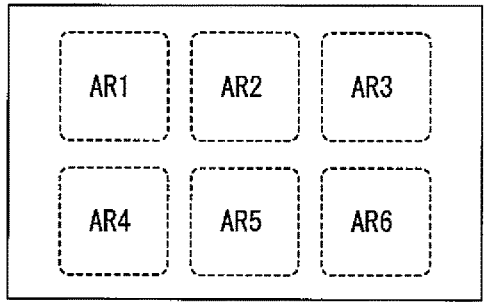
FIG.5B
LY2  LAYOUT INFORMATION
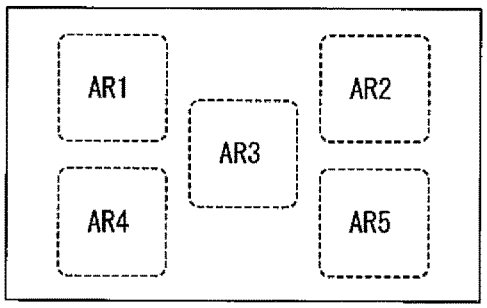
FIG.5C
LY3  LAYOUT INFORMATION
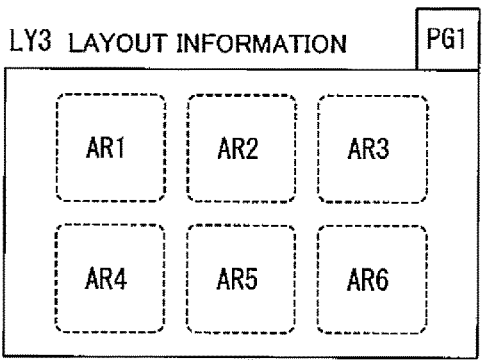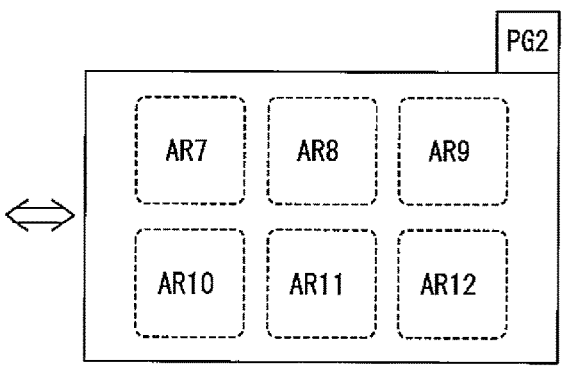
FIG.5D

FIG.6

TYPE CORRESPONDENCE TABLE

| VEHICLE MODEL | RANK | PATTERN | BACKGROUND ID | SWITCH PLACEMENT INFORMATION | | INSTALLABLE SWITCH INFORMATION |
|---|---|---|---|---|---|---|
| | | | | LAYOUT ID | SWITCH-AREA CORRESPONDENCE INFORMATION | |
| MODEL A | 1 | 1 | BS1 | LY1 | ... | ... |
| | | 2 | BS1 | LY1 | ... | ... |
| | 2 | 1 | BS1 | LY2 | ... | ... |
| | 3 | 1 | BS3 | LY2 | ... | ... |
| | | 2 | BS3 | LY2 | ... | ... |
| | | 3 | BS5 | LY1 | ... | ... |
| MODEL B | 1 | 1 | BS2 | LY3 | ... | ... |
| | 2 | 1 | BS1 | LY5 | ... | ... |
| | 3 | 1 | BS5 | LY5 | ... | ... |
| | 4 | 1 | | | | |
| ... | | | | | | |

PLACEMENT INFORMATION FOR DISPLAY
(COPY DEFAULT SWITCH PLACEMENT INFORMATION)

PLACEMENT INFORMATION FOR DISPLAY
(RIGHT-LEFT INVERSION)

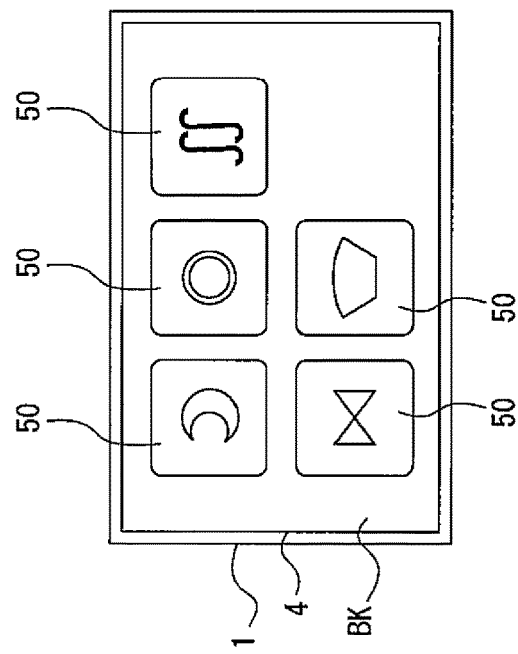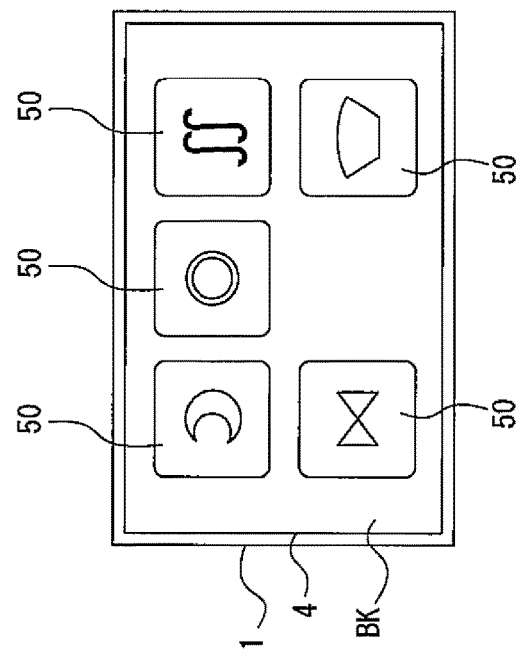

TOUCH PANEL SWITCH DEVICE

CROSS REFERENCE TO RELATED APPLICATION

The priority application Japanese Patent Application No. 2017-154300 upon which this patent application is based is hereby incorporated by reference.

FIELD OF THE INVENTION

The present disclosure relates to a touch panel switch device configured to display various switch images to allow a user to perform touch operations.

BACKGROUND ART

An operation device using a tough panel is widely used, and is mounted on various apparatus to be used differently from a mechanical switch device. For example, Japanese Patent Application Publications No. 2017-056860 and No. 2017-047782 each discloses a touch panel device to be mounted on a motor vehicle.

SUMMARY OF THE INVENTION

Depending on a field of apparatus, number of switches to be mounted is increasing and required switches are continuing to diversify. For example, in case of a motor vehicle, many switches are used to turn on and off various functions. Especially, in recent years, respective functions are electronically controlled thus requiring many switches. In case of the motor vehicle, mechanical switches are still being used mainly though touch panel switch devices are partially used.

Since only a limited space is provided around a driver's seat for placing the switches, it is getting more difficult to address the increase in the number of switches. Further, in case of a motor vehicle, the required types and number of switches are different depending on vehicle models, grades, optional functions and such. For example, the number of switches and the combination of the switches to be mounted vary in a production line of the same vehicle model. Thus, the switches are more diversified when producing vehicles of various models. Therefore, it is difficult to commonalize a switch module for the vehicle, adversely affecting the efficiency of the process. Also, if a further function is to be added after the production, then an addition or a replacement of the switch itself is required.

These drawbacks become an issue especially in using the mechanical switches, however it is the same in using the touch panel switch for a specific operation. Thus, the issues related to the installation space for the switches and the various switch combinations remain.

An object of the invention is to simplify a mounting of switches, improve production efficiency and simplify handling of a change in function, for many and/or various combinations of operations required in a motor vehicle or in other apparatus.

To achieve the above-mentioned object, the present invention according to a first aspect provides a touch panel switch device including a display panel, a touch panel placed correspondingly to the display panel, a storage part which stores switch image information according to respective operation functions, code information according to the respective operation functions and placement information for display designating placement of switch images to be displayed on the display panel, and a control part configured to make the display panel to display the switch images according to the switch image information and the placement information for display, in accordance with a touch operation onto the touch panel, read out from the storage part the code information corresponding to the switch image displayed at a location of the touch operation, perform output control of the code information, and also perform a rewrite process of the placement information for display based on received information. The placement information for display designates layout (i.e., setting of a frame for switch placement areas) and designates which switch image is placed to each area. The control part allots the switch images to the respective areas based on the placement information for display and makes the display panel to display the switch images. The control part is configured capable of rewriting the placement information for display.

In the touch panel switch device described above, the storage part stores a type correspondence table indicating switch placement information designating placement of the switch images to be displayed on the display panel for each of types of a mounted apparatus on which the touch panel switch device is mounted, and the control part may update the placement information for display using the switch placement information read out from the type correspondence table, in accordance with receipt of type information. The type of the mounted apparatus is, if the mounted apparatus is an automobile, a vehicle model, grade and such. The storage part stores the type correspondence table in which default switch placement information is stored in accordance with the above-mentioned type.

In the touch panel switch device described above, the control part may make a request for transmission of the type information to the mounted apparatus, and to update the placement information for display using the switch placement information read out from the type correspondence table in accordance with receipt of the type information transmitted in response to the request. For example, after the touch panel switch device is mounted to the mounted apparatus such as a vehicle and when the touch panel switch device becomes communicable with the mounted apparatus, the control part makes a request for transmission of the type information to the mounted apparatus. Subsequently, the control part looks up the type correspondence table based on the received type information and determines the switch placement information, and performs the setting of the placement information for display.

In the touch panel switch device described above, the control part is configured to update the placement information for display based on receipt of right/left application information, such that the placement of the switch images is designated to be for a right application or a left application. For example, while the current placement of the switch images designated in the placement information for display is for a right application, and if the left application information is received, then the designation for placement of switch images is inversed right side left (i.e., inversed horizontally). Consequently, the placement of the plurality of images to be displayed is inversed right side left. Alternatively, when writing the default switch placement information in the placement information for display, if right application information is received while the default switch placement information is set for a left application, then the default switch placement is inversed right side left and is set in the placement information for display.

In the touch panel switch device described above, the right/left application information is information indicating whether a vehicle on which the touch panel switch device is mounted is a right-hand steering wheel vehicle or a left-hand steering wheel vehicle. Thus, as the touch panel switch device to be mounted to a vehicle, by enabling the right-side-left inversion of the switch placement depending on the right-hand steering wheel vehicle or the left-hand steering wheel vehicle, it is easy to deal with the right-hand and left-hand steering wheel vehicles.

In the touch panel switch device described above, the storage part stores a background table in which a plurality of background image patterns is stored, and the control part may perform display of a background of the switch images on the display panel using the background image pattern designated by a background designating information. For example, the plurality of background image patterns may be prepared and the user/operator may select one of those to match the background with color or texture of the surrounding environment at which the touch panel switch device is mounted.

In the touch panel switch device described above, the control part may update the placement information for display in accordance with receipt of information of switch addition, switch placement change, switch deletion or layout change. The placement information for display designates layout (i.e., setting of the switch placement areas) and designates which switch image is placed to each area, and the control part performs the display according to that placement information for display. Thus, by updating the placement information for display according to the received information of switch addition, switch placement change, switch deletion or layout change, the form of display can be changed.

According to the present invention, since the touch panel switch device includes the switch image information and the code information of the respective operation function, the switches of various operation functions can be provided by rewriting the placement information for display. Consequently, the present invention provides the versatile touch panel switch device that can be used in various productions and applications such as motor vehicles of various types, and can provide various switches in a flexible fashion, while improving the process efficiency and reducing the number of components and reducing the production cost.

BRIEF DESCRIPTION OF THE DRAWINGS

The foregoing aspects and other aspects of the disclosure are described in detail below in connection with the accompanying drawings in which:

FIGS. 4A, 4B and 4C illustrate a switch image table, a background table and a switch function table, respectively, according to the embodiment;

FIG. 5A illustrates a layout table according to the embodiment, and FIGS. 5B, 5C and 5D illustrate layout information according to the embodiment;

FIG. 6 illustrates a type correspondence table according to the embodiment;

FIGS. 9A and 9C illustrate placement information for display according to the embodiment, and FIGS. 9B and 9D illustrate displays obtained based on the placement information for display of FIGS. 9A and 9C, respectively;

DETAILED DESCRIPTION OF EXEMPLARY EMBODIMENT OF THE INVENTION

The following will explain one embodiment of the present invention.

1. Configuration of Touch Panel Switch Device

Figure 1:
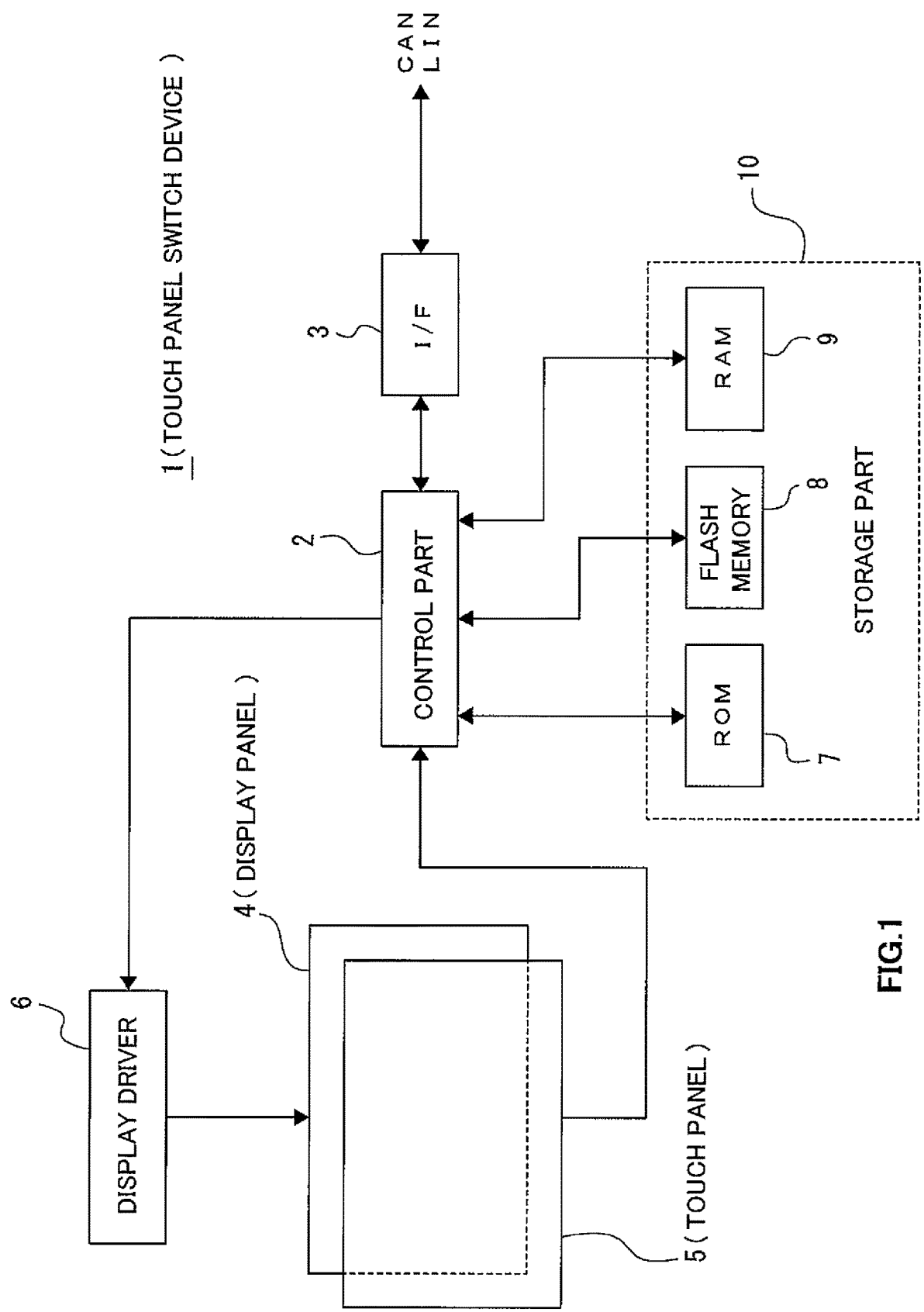
FIG. 1 is a block diagram of a touch panel switch device according to one embodiment of the present invention.

FIG. 1 shows an exemplary construction of a touch panel switch device 1 according to the embodiment. The touch panel switch device 1 of the embodiment is configured to be mounted around a driver's seat of an automobile to provide an operation button for a function provided to the automobile.

The touch panel switch device 1 includes a control part 2, an interface part (hereinafter called, "I/F part") 3, a display panel 4, a touch panel 5, a display driver 6 and a storage part 10. The storage part 10 is shown in FIG. 1 as a storage area including a ROM (Read Only Memory) 7, a flash memory 8 and a RAM (Random Access Memory) 9 and such.

The display panel 4 is constituted of a liquid crystal panel or an organic EL (Electroluminescence) panel or the like, for example, and is configured to display a switch image and such, as will be described later. The display panel 4 is activated by the display driver 6. In accordance with the control by the control part 2, the display driver 6 supplies a display data and a synchronization signal to the display panel 4 to display one or more switch images required to be displayed on the display 4 in a set predetermined placement condition.

The touch panel 5 is positioned so as to overlap with respect to a display plane of the display panel 4. The touch panel 5 is an electrostatic capacity type or a resistive type touch panel, for example, and is configured to detect a touch operation of a user. Information about a touch operation location on the touch panel plane is detected by the control part 2. The control part 2 associates the detected information with coordinate information of the switch images to be displayed and detects which switch image is operated by the user.

The I/F part 3 is connected to a network in the vehicle such as a CAN (Controller Area Network) or a LIN (Local Interconnect Network) to transmit and receive the information. The control part 2 can perform various information communication with one or more ECUs (Electronic Control Units) on the vehicle side via the I/F part 3. The I/F part 3 may be an interface which corresponds to a wired LAN (Local Area Network) or a wireless LAN terminal, or may function as an USB (Universal Serial Bus) interface to be capable of communicating with a system outside the vehicle (such as a computer device).

The control part 2 includes a CPU (Central Processing Unit) and performs an overall control of the touch panel switch device 1. The control part 2 and the storage part 10 may be formed integrally as a microcomputer unit (e.g., a single-chip configuration), or they may be separate chips. The control part 2 and the storage part 10 may be constituted of various types of hardware configurations as long as they are provided with the control function and the storage area for the control function.

In the normal use of the touch panel switch device 1, the control part 2 performs a display control of the switch images and such, a process of detecting the operation by the touch panel 5, and a process of transmitting the operation code according to the detection of the operation. The display control mentioned above is a control for displaying the predetermined switch image and the background image and presenting the various switches to the user (e.g., a driver). Of course, a message or guidance may be displayed as well other than the switch image and the background image. The above-mentioned process of transmitting the operation code according to the detection of the operation includes transmitting the operation code corresponding to the operated switch image to the ECU on the vehicle side via the I/F part 3. That is, the operation information is transmitted to the ECU as similarly done with the ordinary mechanical switch. An example of the process will be described later in detail.

The process in such normal use is performed on the premise that the control part 2 performs a process of setting a number, a type, a layout and such of the switch image(s) to be presented. In this case, the setting is performed using the information received from the ECU on the vehicle side via the I/F part 3. Alternatively, the control part 2 may be connected to a computer device and such via the I/F part 3 before it is mounted to the vehicle and perform the setting based on the information received from the computer device. Further, the control part 2 may display a setting menu and such on the display panel 4 and waits for a touch panel input by the user with respect to the menu. Then, the control part 2 may perform the setting according to the operation input signal received from the touch panel 5. An example of the setting process will also be described later in detail.

The control part 2 sequentially performs the necessary process in reference to the storage part 10. The operation program for the control part 2, later-described various table information and display placement information are stored in the ROM 7 or the flash memory 8 in the storage part 10. The RAM 9 in the storage part 10 is used as a work area of the control part 2.

Figure 2A:
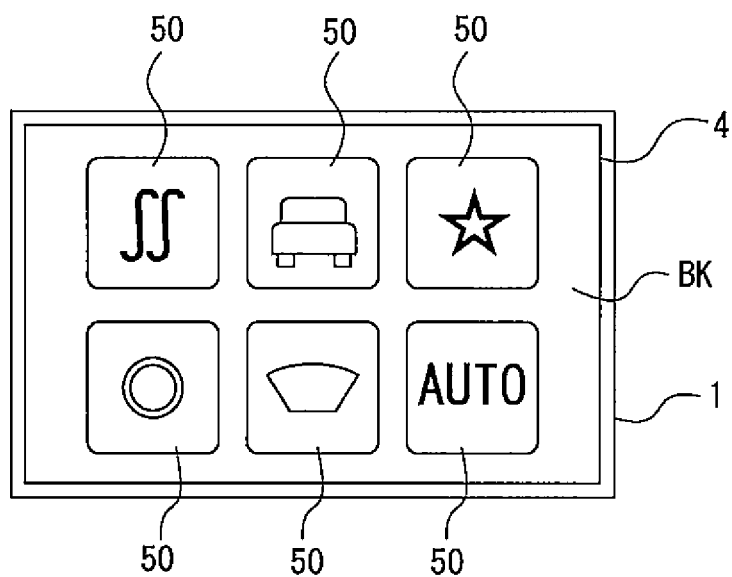
FIGS. 2A, 2B and 2C illustrate various display forms of the touch panel switch device according to the embodiment.
Figure 2B:
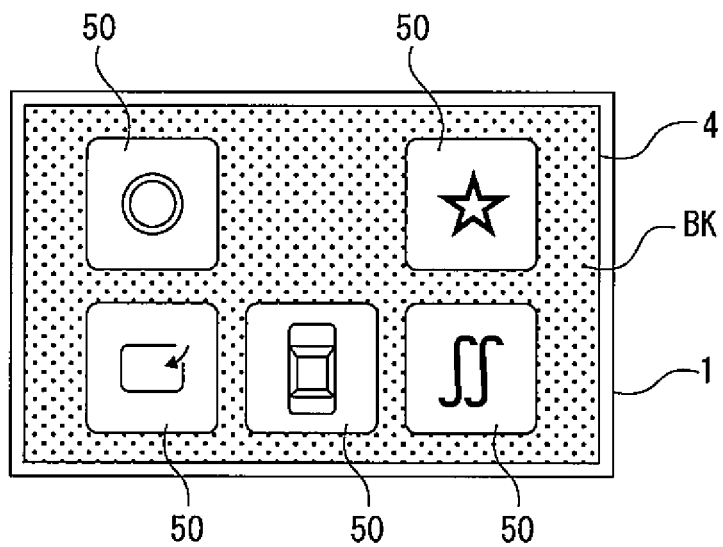
Figure 2C:
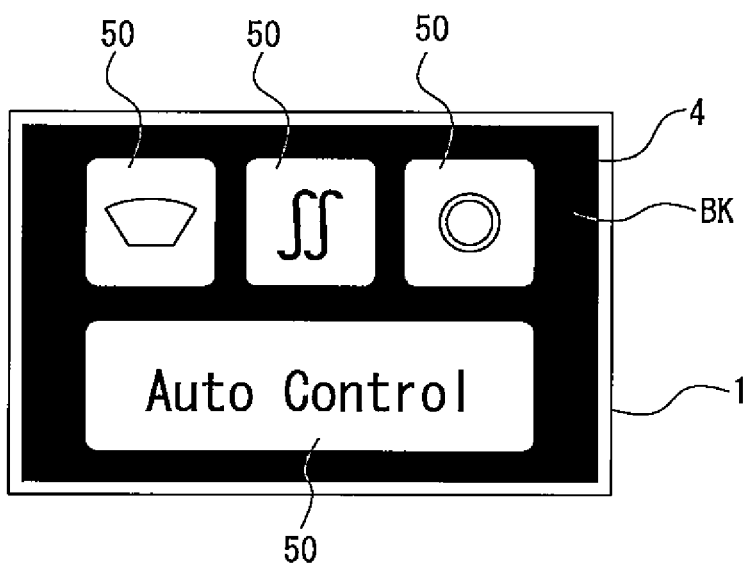

On the touch panel switch device 1 having the above-described configuration, the switch images are displayed as exemplary shown in FIGS. 2A, 2B, 2C and FIG. 3. FIGS. 2A, 2B and 2C respectively show various examples displayed by the setting process. As shown, several switch images 50 are presented on the display panel 4. Although not shown, only one switch image 50 may be displayed.

Each switch image 50 may represent (imitate) a pushbutton on which a symbol or a character indicative of a function to be turned on or off (i.e., to be operated). Assuming the case of the vehicle, it is a meandering prevention function switch, a mirror open/close switch, a switch of a specific lamp or the like. As shown, the presented number, size, layout and such of the switch images 50 can vary. That is, according to this embodiment, the necessary switch images 50 are presented in accordance with the model, grade, type, optional functions and such of the automobile on which the touch panel switch device is mounted. Further, a background BK of the switch image 50 can also be set in various fashions. For example, the color, design, pattern, texture or the like of the background BK can be set. The texture herein means an image imitating materials such as a wood-grain and a metal.

Figure 3:
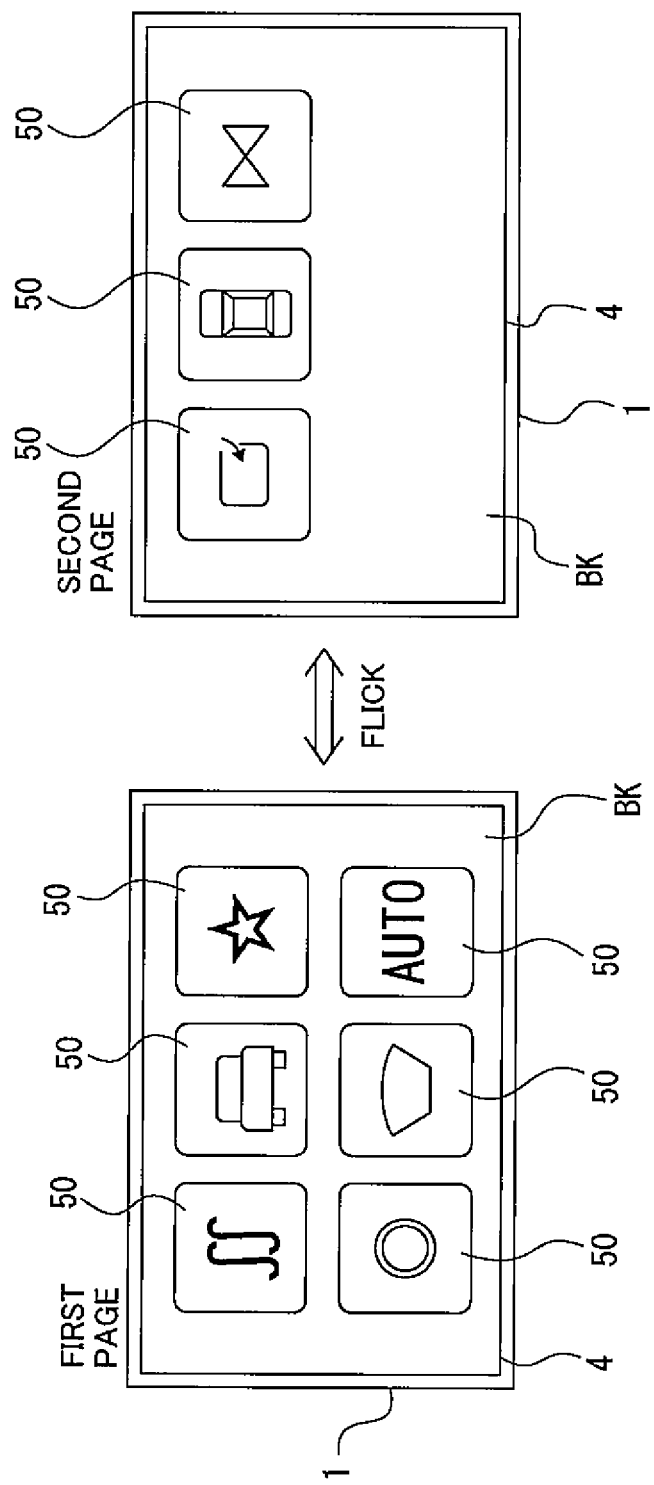
FIG. 3 illustrates displaying of a plurality of pages in the touch panel switch device according to the embodiment.

Although six switch images 50 are presented in FIG. 2A for example, it may be desirable to present more switch images 50 depending on the function of the vehicle or to meet the user's requests. Of course, by reducing the size of the switch images 50, it is possible to display more switch images 50 in one screen. However, considering the operation performance, it is desirable to keep the size of the switch image 50 in a certain size. Thus, more switch images 50 can be presented by performing a page transition as shown in FIG. 3. For example, in an initial state the six switch images 50 are presented on a first page, and then in accordance with a flick operation and such of the user a second page may be presented. In this manner, it is possible to present many switch images 50 and also it is possible to address to the addition of the switches after the production of the vehicle. Of course, the page transition may be performed by operations other than the flick operation, such as a slide operation, a page feeding button operation, a scroll bar operation and such on the touch panel 5. Further, the page transition can be made to more than three pages.

Considering the touch panel switch device 1 is a switch module to be mounted on the vehicle, it is necessary to secure the drive safety. Thus, it is desirable that the switch images 50 presented by the touch panel switch device 1 are normally those for the operation before the starting of the running of the vehicle or while the vehicle is stopping. For example, the above-described meandering prevention function switch and the mirror open/close switch are preferable since those are not to be operated while the vehicle is running. The switches for automatic driving and drive support function are also preferable for the same reason. In many cases, it is suitable to position the switches at a lower right location with respect to the handle of the right-hand drive vehicle, thus the touch panel switch device 1 is configured to be positioned at such location. The touch panel switch device 1 may present only the switch image(s) 50 having the operation function operable only while the vehicle is stopping.

In case of the page transition as shown in FIG. 3, the visual checking of the page transition by the driver while the vehicle is running must be avoided. Thus, it is desirable that the second page contains those switch images 50 which need to be operated only during the vehicle stopping. Normally, the first page is displayed while the vehicle is stopping and while the vehicle is running. The second page is presented by the operation by the user while the vehicle is stopping, thereby providing the switch images 50 related to the functions which are only necessary while the vehicle is stopping. To prohibit the driver from visually checking the page transition while the vehicle is running, the touch panel switch device 1 may be configured such that the page transition operation such as the flick operation is permitted only while the vehicle is stopping. Also, after the page has transited to the second page, the page may automatically return to the first page after the predetermined time has elapsed without any operation to prohibit the visual checking by the driver. Alternatively, the page may return to the first page once the start of the running of the vehicle is detected. That is, it is configured to bring the user to recognize that the first page is being displayed all the time.

2. Tables

The following will explain the specific operation of the touch panel switch device 1 according to this embodiment. Firstly, various table data to be used in a later-described process of a normal usage and of a setting.

FIG. 4A shows a switch image table. The switch image table is a table in which switch image data are registered correspondingly to switch IDs (SW1, SW2, . . . ), for example. The switch ID is an unique code as an identifier allotted to each of the operation function. For example, the switch ID "SW1" is set as an identifier of the meandering prevention function switch, and the switch ID "SW2" is set as an identifier of the mirror open/close switch. The switch image is a character image data to be displayed as the switch image 50 as exemplary shown in FIG. 2. Thus, this switch image table is for registering the switch image data for several switches related to the possible functions to be operated in the touch panel switch device 1.

FIG. 4B shows a background table. The background table is a table in which background image pattern data are registered correspondingly to background IDs (BS1, BS2, . . . ), for example. The background ID is an unique code as an identifier allotted to each background pattern. The background image pattern is an image pattern data as a color, design, texture or the like.

FIG. 4C shows a switch function table. The switch function table is a table in which operation codes (CSW1, CSW2, . . . ) are registered correspondingly to switch IDs (SW1, SW2, . . . ), for example. The operation code is a code as operation information corresponding to each switch. When one switch image 50 is operated, the operation code corresponding to that switch image 50 is transmitted to the ECU on the vehicle side as the operation information.

FIG. 5A shows a layout table. The layout table is a table in which number of switches, number of pages and layout information are registered correspondingly to layout IDs (LY1, LY2, . . . ), for example. The layout ID is an unique code as an identifier allotted to each layout. The number of switch is the number of switch images 50 that can be placed in that layout. For example, the number of the switch is six in the layout of FIG. 2A, five in the layout of FIG. 2B, and twelve in the layout with two pages of FIG. 3 in which if maximum of six switches are placed on each page. The number of pages is the number of pages included in the layout. For example, the number of pages is one in the layout of FIG. 2A, and two in the layout of FIG. 3. However, in the example of FIG. 3, the information of the number of pages is not necessary if the layout of the first page and the layout of the second page are to be set individually.

The layout information is information about the specific location of at which the switch is placed. For example, it is an information group indicative of the coordinate locations of the switch placement areas at which the respective switch images are placed. FIGS. 5B, 5C and 5D schematically show the contents of the layout information (i.e., the placement of the switches designated by the layout information) corresponding to the layout ID=LY1, LY2 and LY3, respectively. The layout information corresponding to the layout ID=LY1 contains the coordinate data indicative of the six switch placement areas AR1 through AR6 as shown in FIG. 5B. The layout information corresponding to the layout ID=LY2 contains the coordinate data indicative of the five switch placement areas AR1 through AR5 as shown in FIG. 5C. The layout information corresponding to the layout ID=LY3 contains the page and coordinate data indicating the switch placement areas AR1 through AR12 across the first page PG1 and the second page PG2, as shown in FIG. 5D. In this manner, the layout for the placement of the switch images 50 can be selected within the layout information registered in the layout table.

FIG. 6 show a type correspondence table. The type correspondence table is a table which stores, for example, corresponding background IDs, switch placement information and installable switch information in accordance with the vehicle model, the rank and the pattern of the vehicles to be produced in an automobile manufacturer which uses the touch panel switch device 1. The vehicle model indicates the models of all or some of the vehicles to be produced in this automobile manufacturer, or the models of the vehicles to be mounted with the touch panel switch device 1. The rank indicates the grades of the vehicles of the same model. The pattern indicates the specific types of the vehicles of the same vehicle model and the same grade distinguished by the selectable functions, interior types, vehicle types (e.g., two-doors/four-doors, sedan/one-box, etc.) and such.

Thus, the automobiles to be produced are classified according to the vehicle model, the rank and the pattern in a manner described above, and then the background IDs, the switch placement information and the installable switch information are registered with respect to the respective classified types. The switch placement information contains the layout IDs and the switch-area correspondence information. The switch-area correspondence information is information for designating which switch is placed to each switch placement area (hereinafter just called, "area") in the layout information designated by the layout ID. For example, these information are default set information set in accordance with the types of the automobile defined by the above-mentioned classification.

Figure 7A:
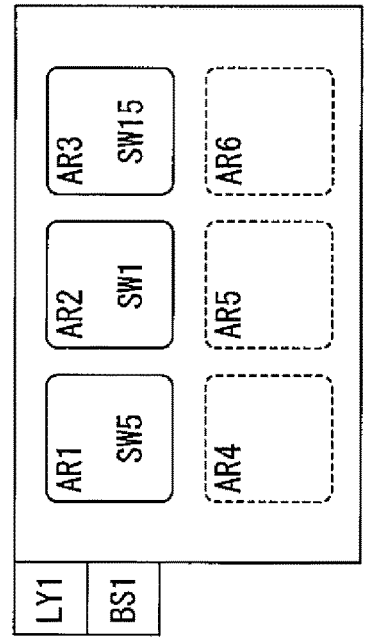
FIGS. 7A, 7B and 7C illustrate switch placement information according to the embodiment.

For example, in the example of FIG. 6, the background ID=BS1, the layout ID=LY1 and the switch-area correspondence information are registered to correspond to the type classified as the model A, rank "1" and pattern "1". With the layout ID=LY1, the layout information indicating the layout shown in FIG. 5B is designated. In the switch-area correspondence information, the switch IDs corresponding to the areas AR1 through AR6 included in this designated layout information are designated, as AR1=SW5, AR2=SW1, AR3=SW15, AR4=SW3, AR5=SW27, and AR5=SW7, for example. Accordingly, in this case, the default switch placement defined by the switch placement information composed of the layout ID and the switch-area correspondence information is given as the one shown in FIG. 7A. For example, the switch placement of FIG. 7A is predetermined such that the switches suitable for the automobile of the type classified as the model A, rank "1" and pattern "1" are placed in a suitable fashion. In a manner described above, the switch placement which is set in advance for each type of the automobile to be produced is indicated by the type correspondence table of FIG. 6 and the layout table of FIG. 5. Also, the default background is designated as the background ID=BS1.

Figure 7B:
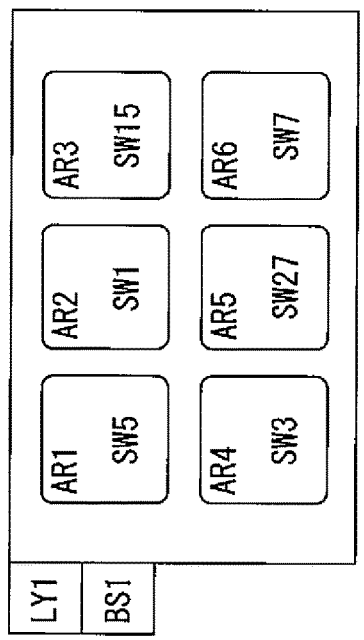

FIG. 7B shows another example of the switch placement set in accordance with another type of the automobile, specifically, the type of the automobile is of the model A, rank "1" and pattern "2", and for this type, the background ID and the layout ID are defined as background ID=BS1 and the layout ID=LY1, and the switch-area correspondence information is defined as AR1=SW5, AR2=SW1, AR3=SW15. No switch IDs are associated with the areas AR4, AR5 and AR6. In this case, three areas are empty areas in the layout defined by the layout ID=LY1. The default background is designated as the background ID=BS1.

Figure 7C:
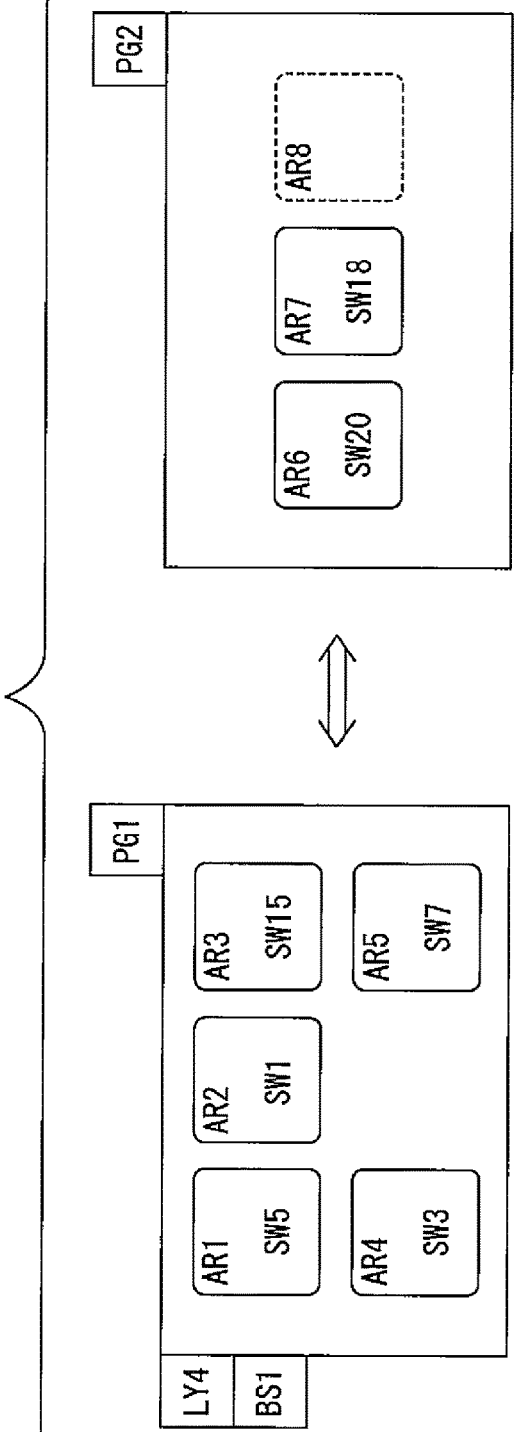

FIG. 7C shows an alternative another example, in which the layout of the first page PG1 and the second page PG2 is designated as the layout ID=LY4, and the switches in the respective areas are designated as shown. Also, the default background is designated as the background ID=BS1.

Referring back to FIG. 6, the type correspondence table further includes the installable switch information. The installable switch information indicates a list of switch functions mountable in the respective classified types of automobile. Alternatively, the installable switch information may indicate switch functions that are not mountable. That is, for example depending on the vehicle model, some functions are not mountable, thus it is not desirable to display the switches for such functions. Thus, to enable to limit the addition of the switch images 50 depending on the vehicle model, the installable switch information is configured to allow determining the switch functions that are not suitable to be placed.

The above-described switch image table, the background table, the switch function table, the layout table and the type correspondence table are stored in the ROM 7 or the flash memory 8. Apparently, by storing the tables in the flash memory 8, the tables can be updated easily.

3. Performing Display Based on Placement Information for Display

In this embodiment, the control part 2 performs the display control of the switch images 50 based on placement information for display. The placement information for display is information which is stored using a specific recording region in the flash memory 8, for example.

Figure 8A:
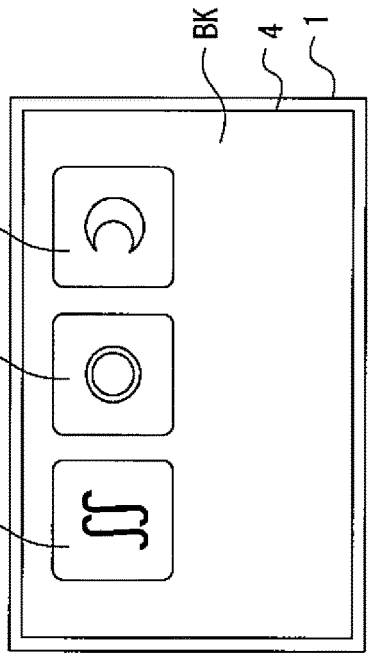
FIGS. 8A and 8C illustrate placement information for display according to the embodiment.
Figure 8B:
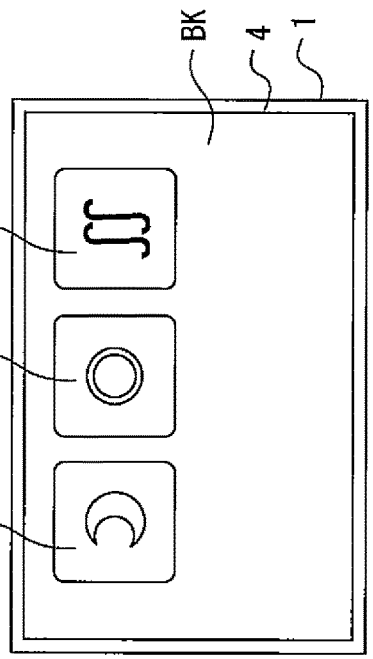
FIGS. 8B and 8D illustrate displays obtained based on the placement information for display of FIGS. 8A and 8C, respectively.

The above-described default switch placement information and the background ID are firstly copied in this placement information for display. FIG. 8A schematically shows the state in which the default switch placement information and the background ID shown in FIG. 7B have been copied as the placement information for display. The control part 2 performs the display based on this placement information for display. In this case, the coordinates of the areas AR1 through AR6 are defined by the switch placement information (i.e., the layout ID and the switch-area correspondence information), the correspondence is made as AR1=SW1, AR2=SW1 and AR3=SW15, and the background is defined as the background ID=BS1. Accordingly, the display is obtained as shown in FIG. 8B. Specifically, the control part 2 reads out the switch image data corresponding to the switch IDs=SW5, SW1 and SW15 from the switch image table, and places the data onto the areas AR1, AR2 and AR3 designated with the coordinates by the placement information for display. Further, the control part 2 reads out the background pattern data of the background ID=BS1 from the background table, and sets the data as the background image. Consequently, three switch images 50 are presented as shown in FIG. 8B, and the background BK is set to a plain white color, for example.

Figure 8C:
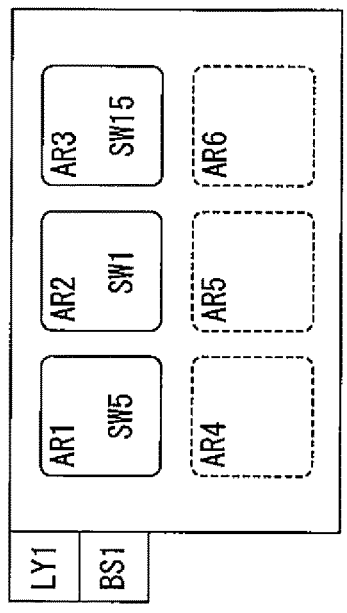
Figure 8D:
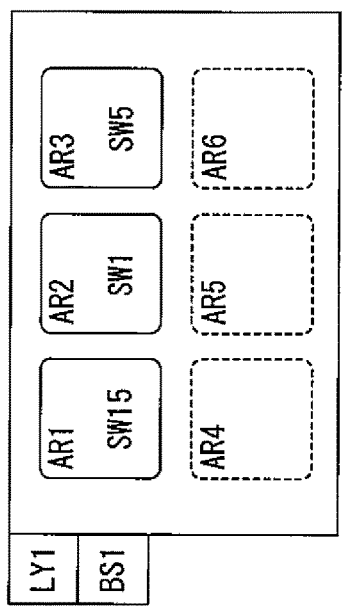

Since the control part 2 is configured to perform the display control in accordance with the placement information for display in a manner as described above, the control part 2 can change the display form by updating the placement information for display. FIG. 8C shows an example of performing the horizontal (i.e., right-side-left) inversion in the update. In this example, the switch-area correspondence information contained in the placement information for display is changed as AR1=SW15 and AR3=SW5. As a result, the display based on the placement information for display is obtained as shown in FIG. 8D, in which the placement of the switch images 50 is inverted horizontally from the state shown in FIG. 8B.

FIG. 9A shows an example for performing the update for adding the switch. In this example, the update is performed so as to add AR4=SW3 and AR5=SW7 in the switch-area correspondence information contained in the placement information for display. As a result, the display based on the placement information for display is obtained as shown in FIG. 9B, in which two switch images 50 are added to the state shown in FIG. 8D.

FIG. 9C shows an example for performing the update for changing the placement of the switch. In the switch-area correspondence information contained in the placement information for display, no switch ID is associated with the area AR5, and, AR6=SW7. Accordingly, the display based on the placement information for display is provided as shown in FIG. 9D, in which the switch image 50 corresponding to "SW7" is displaced to the right hand side from the state of FIG. 9B.

By updating the placement information for display in the manner described above, the number, type and placement of the switch images to be provided to the user can be changed.

In case of the touch panel switch device for the vehicle, for the switches designated as a default, only the right-side-left inversion may be possible. For example, for an automobile of a specific type, it may be desirable to make the switch images with the default placement to be unchangeable. This is the case for example if the placement for the minimum switches required is fixed in view of operation performance. However, in some cases such switch placement should be inverted horizontally (inverted in right side left) depending on whether the automobile has the right-hand steering wheel or the left-hand steering wheel. Thus, only the right-side-left inversion may be applied to the default switch placement, as shown in FIGS. 8A-8D. Of course, the placement change and deletion may be made arbitrarily in the default switch placement information. Meanwhile, for those switches added and not designated as default as in the example of FIGS. 9A and 9B, the placement change or deletion may be made arbitrarily, thereby allowing the car manufacturers, dealers and the users to add or delete functions or change the placement as desired.

4. Example of Process in Use

Figure 10:
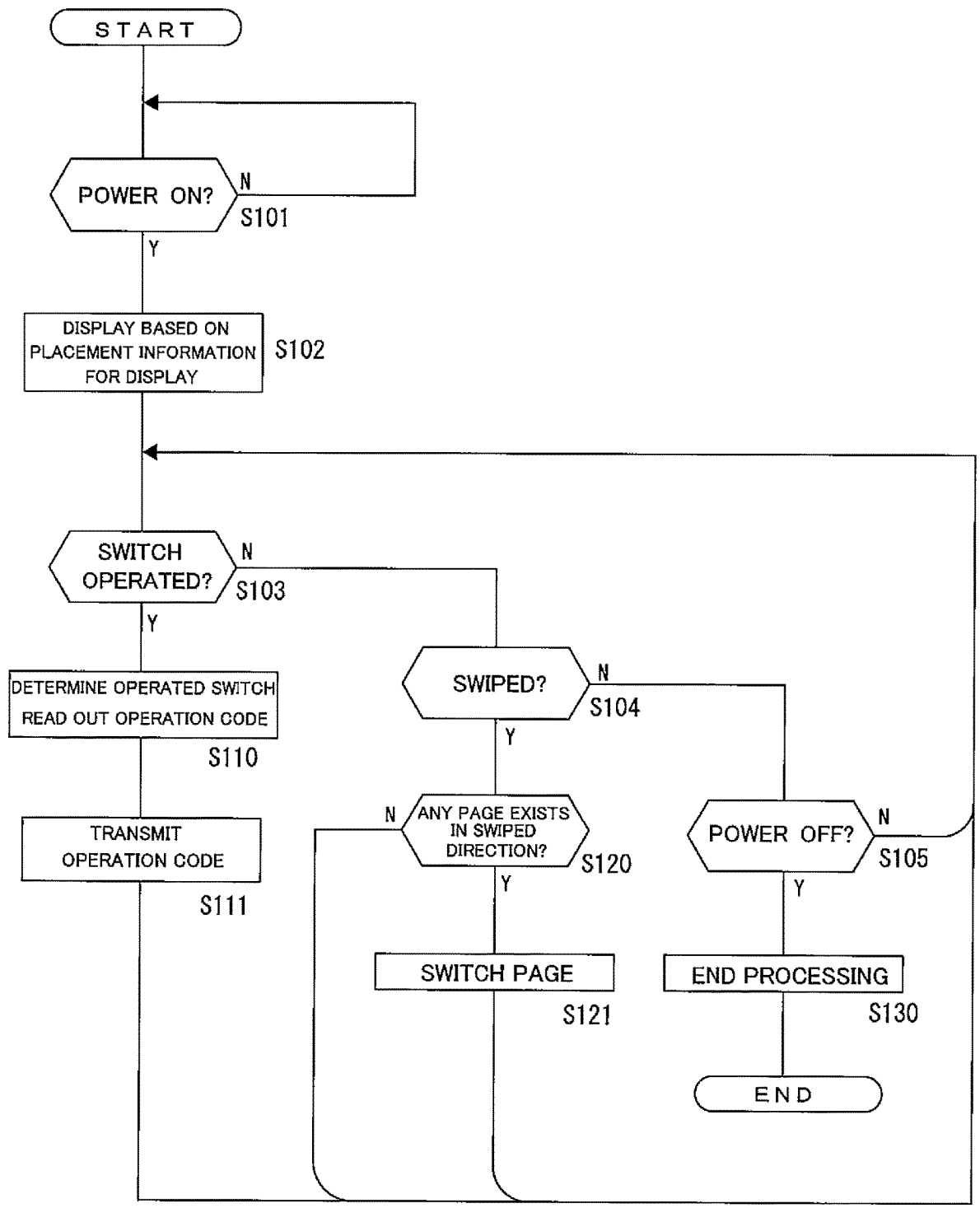
FIG. 10 is a flow chart showing a process in use according to the embodiment.

The following will explain an example of the process performed by the control part 2 of the touch panel switch device 1 mounted on the automobile, for example, in the normal use, in reference to FIG. 10.

The control part 2, once it detects a power-on in step S101, proceeds to step S102 in which it performs the display control based on the placement information for display. In the case of the automobile, the power-on described above is referred to as a turn-on of an ignition or a turn-on of an accessory. The power-on provides the display based on the placement information for display at that time point (refer to FIGS. 8A-8D and FIGS. 9A-9D), providing the user (e.g., driver) with the switches for various functions as the switch images 50.

While displaying the switch images 50, the control part 2 enters into a monitor loop for performing monitoring of operation of the switch in step S103, monitoring of a swipe operation in step S104, and monitoring of power-off in step S105. Once the control part 2 detects that the user has performed the pushing operation of the switch image 50 by the signal from the touch panel 5, the control part 2 proceeds from the step S103 to the step S110, in which the control part 2 identifies the operated switch (i.e., the switch ID) using the coordinate corresponding to this operated location, refers to the switch function table and reads out the corresponding operation code. Then, in step S111, the control part 2 transmits the operation code from the I/F part 3 to the ECUs on the vehicle side. In the manner described above, the touch panel switch device 1 functions as the operation module of the vehicle.

Once the control part 2 detects that the user has performed the swipe operation by the signal from the touch panel 5, the control part 2 proceeds from step S104 to step S120, in which the control part 2 checks whether or not any page exists in the operation direction of that swipe operation. If the current layout originally has only one page in that swipe direction, or has a plurality of pages but no page exists in that swipe direction, then the control part 2 does nothing and the process returns to the monitor loop. That is, the control part 2 regards that swipe operation as invalid operation. If a page exists in that swipe operation direction, then the control part 2 proceeds to step S121 and performs a page switching control. That is, the control part 2 displays a next page defined by the placement information for display.

As described above, the page feeding operation may be prohibited while the vehicle is running, for example. In this case, if the swipe operation is detected, the control part 2 determines whether the vehicle is running or not, and if it is the control part 2 regards that operation as invalid operation. The information of running state may be obtained from the vehicle side, or may be self-detected with a gyroscope sensor or a position sensor or the like provided in the touch panel switch device 1.

Once the power-off is detected, the control part 2 proceeds from step S105 to step S130 and performs an end process to end the display.

5. Example of Setting Process

The following will explain an example of a setting process for enabling the touch panel switch device 1 to be used as the switch module as described above. The setting process may be performed during the manufacturing of the automobile when the touch panel switch device 1 is mounted to the automobile and the communication between the touch panel switch device 1 and the ECUs is performed, or before the touch panel switch device 1 is mounted to the automobile and when the communication between the touch panel switch device 1 and the computer device is performed. Also, the update setting may be implemented after the shipment of the automobile by dealers or by repair/maintenance operators, for example.

Figure 11:
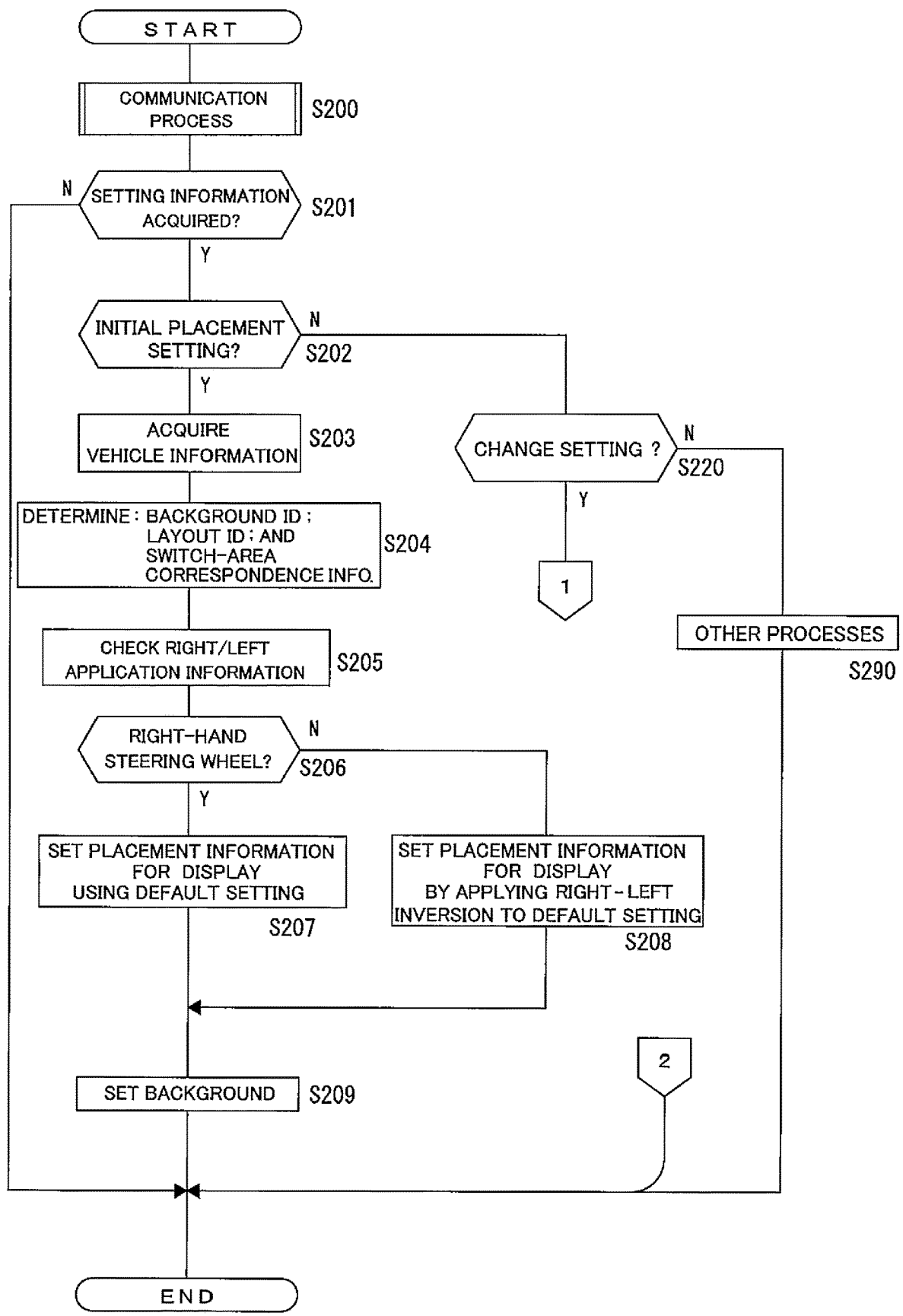
FIG. 11 is a flow chart showing a setting process according to the embodiment.
Figure 12:
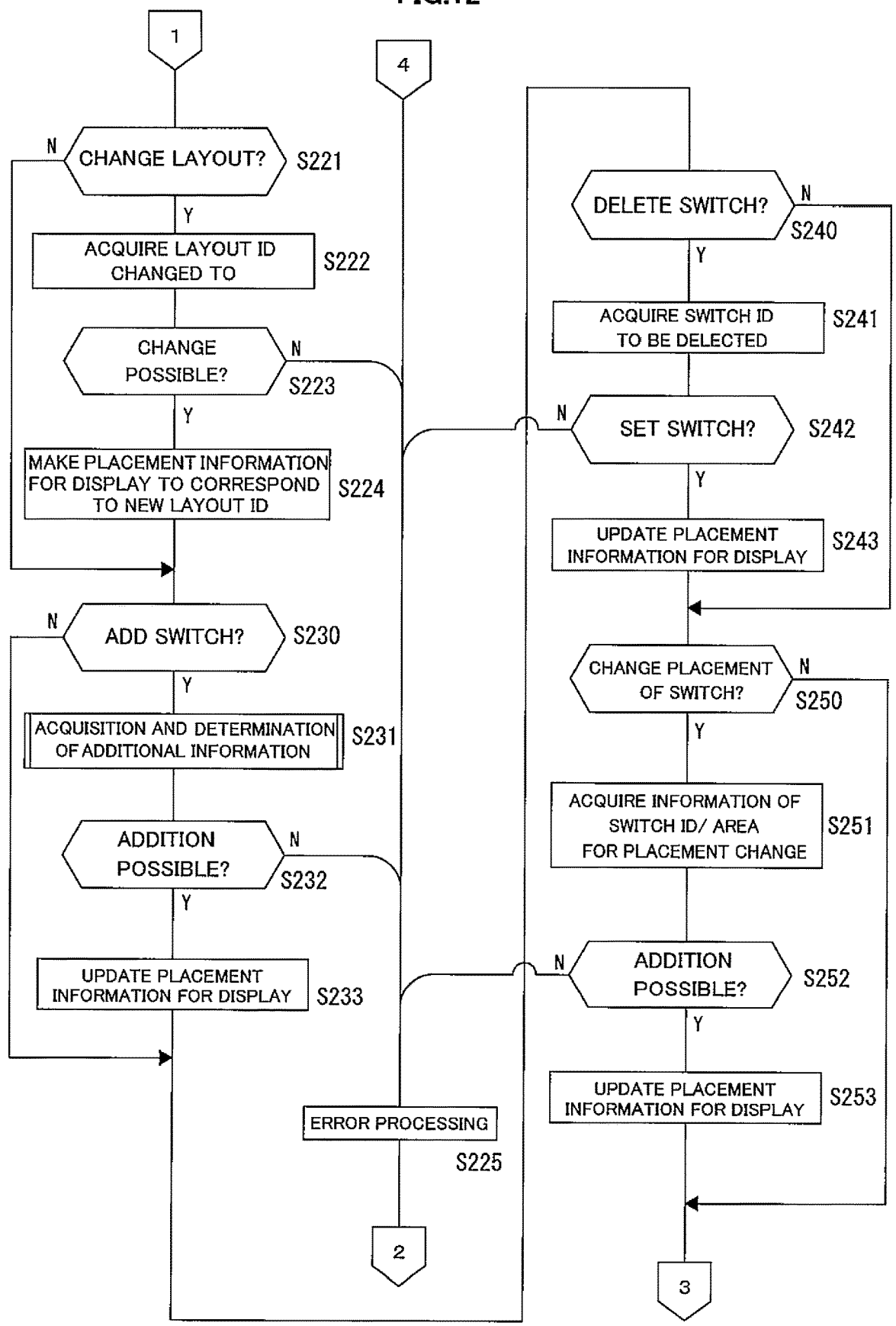
FIG. 12 is a flow chart showing a setting process according to the embodiment.
Figure 13:
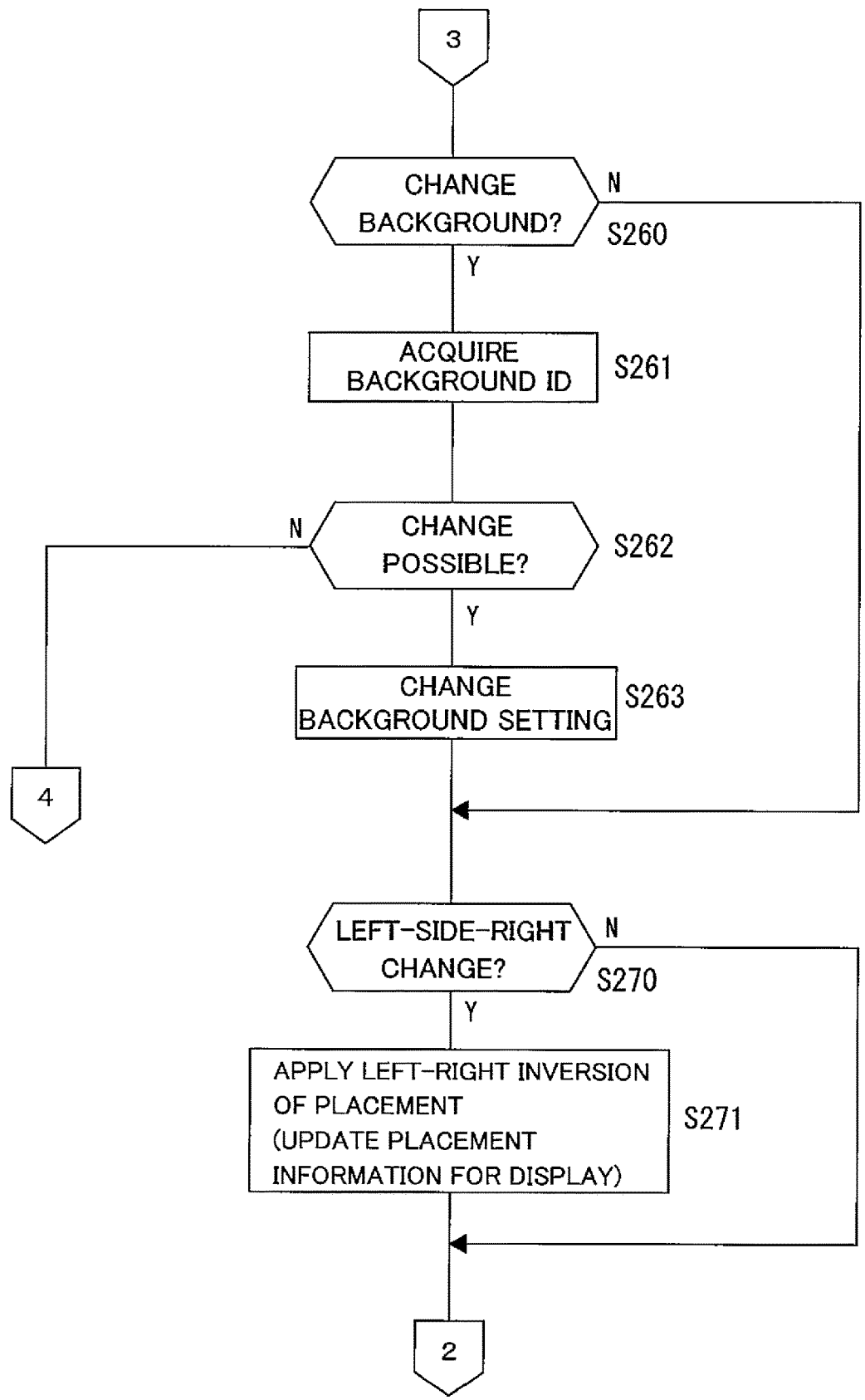
FIG. 13 is a flow chart showing a setting process according to the embodiment.

FIG. 11, FIG. 12 and FIG. 13 indicate the setting process of the control part 2. FIG. 11, FIG. 12 and FIG. 13 are linked with respect to each other via the references "1", "2", "3" and "4" shown in the drawings.

In step S200, the control part 2 performs a communication process with the ECUs on the vehicle side or with the external computer device and such, and performs the setting process in accordance with the achievement of the receipt of the information for the setting in this communication process. If the information for setting could not be received in the communication process (including if the communication was not for the setting process), then the control part 2 ends the setting process and will perform other processes.

Figure 14A:
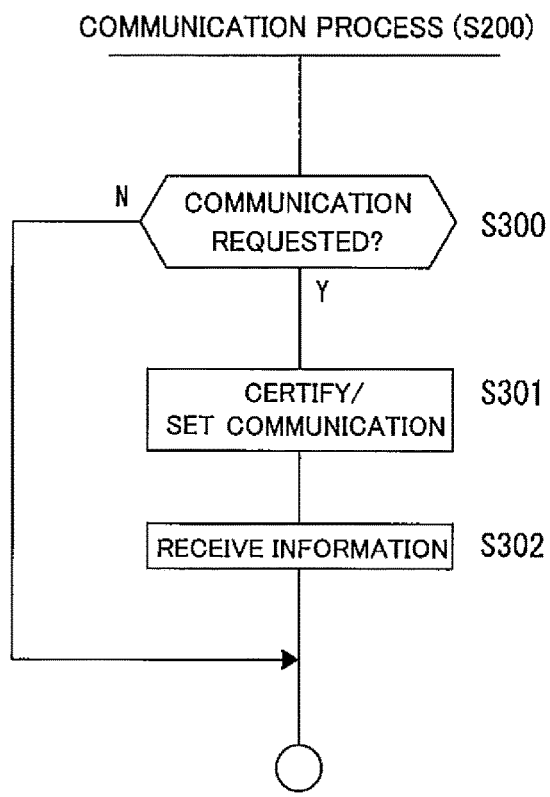
FIGS. 14A and 14B are flow charts showing communication processes according to the embodiment.
Figure 14B:
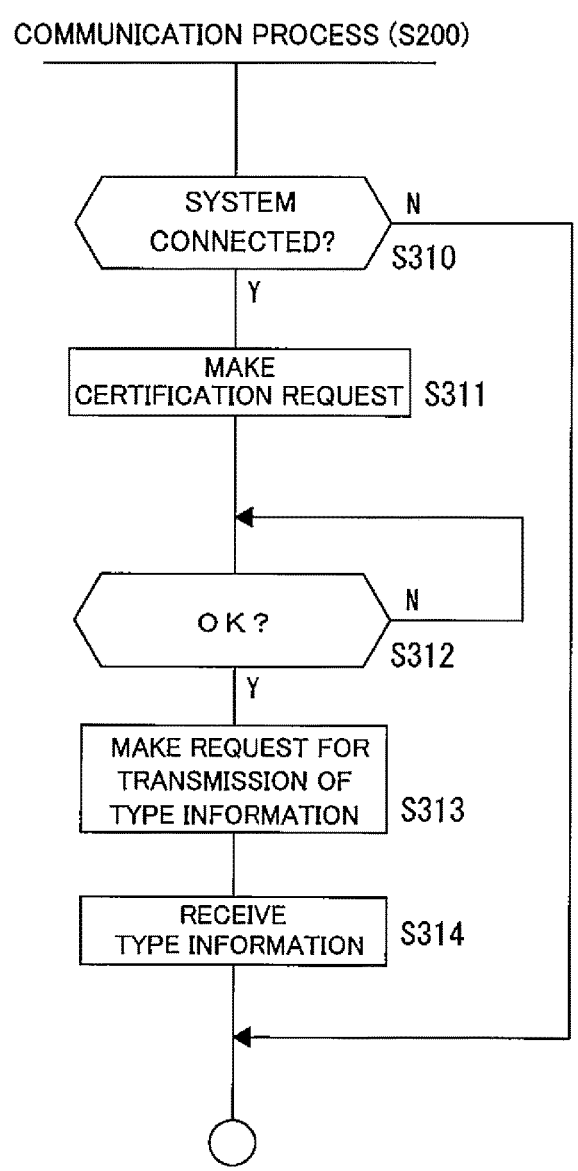

Referring to FIGS. 14A and 14B, an example of the communication process of step S200 is shown. FIG. 14A shows an example where there is a communication request from the external device such as the ECU, for example. In step S300, the control part 2 checks whether or not it has received the communication request from the external device. If no communication request is received, the control part 2 ends the communication process. In this case, the process of FIG. 11 also ends. If there was a communication request from the external device, the control part 2 performs a certification process or a communication setting process in step S301. In accordance with the certification accepted or the completion of the communication setting, the control part 2 receives information in step S302. This information may contain setting information (specifically, information of type according to the classification in the type correspondence table of FIG. 6), or may contain other information. Although not shown, the communication ends if the certification is not accepted.

FIG. 14B shows an example in which the control part 2 makes a request for the setting information with respect to the external device connected to the touch panel switch device 1. In step S310, the control part 2 monitors whether or not the touch panel switch device 1 is connected to the other apparatus/devices via the I/F part 3. During the period in which the touch panel switch device 1 is not connected to the other apparatus/devices, the communication process ends. If the touch panel switch device 1 is mounted on the vehicle (hereinafter, the vehicle mounted with the touch panel switch device 1 is called "the mounted vehicle"), for example, and the control part 2 has detected that the I/F part 3 has become communicable by the CAN or LIN, the control part 2 proceeds to step S311 and makes the certification request with respect to the ECU, for example. Then, the control part 2 waits for the certification accepted in step S312, and once the certification is accepted the control part 2 makes a request for transmission of the type information with respect to the ECU in step S313. Subsequently, in step S314, the control part 2 received and acquires the type information and other information transmitted from the ECU and such in accordance with the above-described request for transmission of the type information.

By performing the communication process as described above, the control part 2 determines whether or not the information related to the setting (i.e., the setting information) has been acquired, in step S201 of FIG. 11. If the information related to the setting has been received, the control part 2 divides the process depending on whether the acquired information is the information of the initial placement setting, the information of the setting change or the information other than those (other information). In case of the other information, the control part 2 performs the process in accordance with that other information in step S290, and the details of which are omitted herein.

The following will explain the processes to be performed when the information of the initial placement setting is acquired. The control part 2 proceeds from step S202 to step S203, and acquires the vehicle information out of the received setting information. Specifically, the vehicle information is the information of type according to the classification in the type correspondence table of FIG. 6, i.e., the information of the vehicle model, rank and pattern. With the receipt of this information of the vehicle model, rank and pattern from the ECU, for example, the type indicated in the type correspondence table can be identified. In step S204, the control part 2 refers to the type correspondence table, identifies the background ID and the switch placement information (i.e., the layout ID and the switch-area correspondence information) and reads them out. Preferably, the control part 2 is configured to store in the flash memory 8 the information indicating the type of the mounted vehicle containing the vehicle model, rank and pattern, when it receives that information, so the control part 2 can sequentially check the type of the mounted vehicle.

Next, in step S205, the control part 2 checks the right/left application information out of the received setting information. The right/left application information indicates whether the mounted vehicle is the vehicle with the right-hand steering wheel or the vehicle with the left-hand steering wheel. It is assumed herein that the switch placement information in the type correspondence table is set for the vehicle with the right-hand steering wheel. In case of the vehicle with the right-hand steering wheel, the control part 2 proceeds from step S206 to step S207, and copies the default setting of the switch placement information to the placement information for display without any change. For example, the control part 2 sets the switch placement of the placement information for display shown in FIG. 8A. In case of the vehicle with the left-hand steering wheel, the control part 2 proceeds from step S206 to step S208, and copies the default setting of the switch placement information to the placement information for display after horizontally inverted the placement of the switch images 50. For example, in the case of the vehicle with the right-hand steering wheel the placement information for display is provided as shown in FIG. 8A, but in the case of the vehicle with the left-hand steering wheel the switch placement is set as shown in the placement information for display of FIG. 8C.

Then, the control part 2 performs the background setting in step S209. That is, the control part 2 adds the background ID designated by the type correspondence table to the placement information for display. Accordingly, the initial placement setting ends. The placement information for display is produced in the manner described above, and after that the control part 2 is able to make the display panel 4 to display with the switch placement and the background defined by the placement information for display in the process shown in FIG. 10.

The control part 2 may receive the information for making various changes in the switch placement setting or in the background, by the communication process of step S200 of FIG. 11 described above. In this case, the control part 2 proceeds from step S220 of FIG. 11 to step S221 of FIG. 12, and performs the process according to the received information.

If the received setting information contains the information of the layout change, the control part 2 proceeds from step S221 to step S222. The information of the layout change may contain, for example, a request for change, and the layout ID indicating a new layout to be changed to. The control part 2 acquires the new layout ID in step S222, and determines whether or not the change from the current layout to the layout indicated by the layout ID is possible. For example, the change is not possible if the layout does not provide enough number of areas to which the switch images 50 can be placed. If the change is determined to be not possible, the control part 2 proceeds to step S225 and performs an error processing, and after that returns to FIG. 11 and ends the setting process. If the layout change is possible, the control part 2 proceeds to step S224 and updates the placement information for display such that the placement information for display corresponds with the new layout ID. That is, the coordinate information of the respective areas AR1, AR2, . . . are reconfigured. By updating the layout ID associated with the placement information for display, the control part 2 can provide the display of the switch images 50 with the layout changed based on the new layout information.

Figure 15:
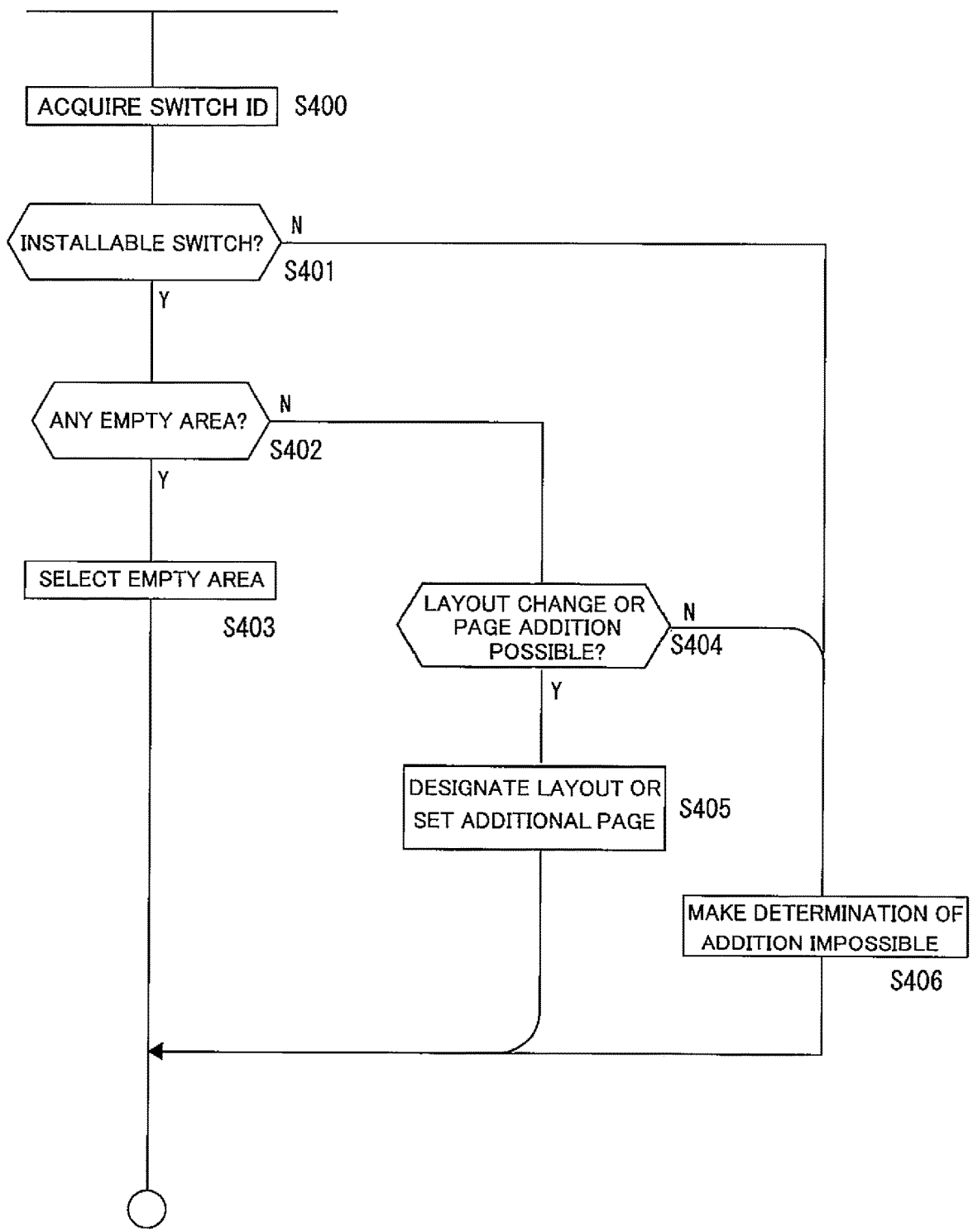
FIG. 15 is a flow chart showing a process of acquisition and determination of additional information according to the embodiment.

If the received setting information contains the information of addition of switch, the control part 2 proceeds from step S230 to step S231. The control part 2 acquires the information of addition and determines whether or not the addition is possible in step S231. The process of this step S231 is shown in FIG. 15.

Firstly, the control part 2 acquires the switch ID designating the switch function to be added in step S400. In step S401, the control part 2 checks whether or not the switch can be additionally installed by referring to the installable switch information in the type correspondence table. More specifically, the control part 2 checks whether or not the switch function to be added corresponds to the switch function that is predetermined as not installable in the mounted vehicle indicated by the type information containing the vehicle model, rank and pattern. If the switch function to be added corresponds to the switch function that is not installable, then the control part 2 proceeds to S406 and determines that the addition is impossible (e.g., sets a flag indicating the impossible addition to be on).

If the switch is determined to be the switch that is additionally installable in step S401, then the control part 2 proceeds to step S402 and checks whether or not there is an empty area in the current layout. Specifically, the control part 2 checks whether or not there is an area to which no switch ID is allotted in the placement information for display. If the empty area exists, then the control part 2 selects one of the empty areas as a location for the new switch function. This selection may be made automatically by configuring to select the lowest area number in the empty areas. Alternatively, if the received setting information contains the area designating information, that designated area is selected.

If no empty area exists, then the control part 2 proceeds from step S402 to step S404 and determines whether or not the layout change or the page addition is possible. Specifically, such determination is made with respect to whether or not the layout can be changed to the layout with many layers or the layout with two-page configuration. If the layout information is set in a page basis, then the determination is made with respect to whether or not the page addition is possible. For example, if there is a limit for number of pages, the determination is made with respect to whether or not the page addition can be made within that limitation.

If the layout change and such cannot be made, then the additional switch cannot be placed. Thus, the control part 2 proceeds from step S404 to step S406 and determines that the addition is impossible. On the other hand, if the layout change and such is possible, the control part 2 proceeds from step S404 to step S405 and designates a new layout ID. Alternatively, the control part 2 performs the setting for the page addition.

As described above, step S231 of FIG. 12 is performed as shown in FIG. 15. In step S232, the control part 2 checks whether or not the determination that the addition is possible has been made in the previous step S231. If the determination that the addition is impossible was made, then the flag indicating the impossible addition has been set to be on in step S406. In this case, the control part 2 checks the flag indicating the impossible addition in step S232, and if the flag is on, then the error processing is performed in step S225 and the setting process ends.

If the addition is possible, the control part 2 proceeds to step S233 and updates the placement information for display. That is, a new switch ID is associated to the empty area. Alternatively, the layout ID is changed, and the previous switch IDs and a new switch ID are associated to the respective areas. Consequently, the control part 2 can perform the display of the switch images 50 with the switch added according to the placement information for display.

If the received setting information contains the information of the switch deletion, then the control part 2 proceeds from step S240 to step S241. In step S241, the control part 2 acquires the information of the switch to be deleted designated by the received information. In step S242, the control part 2 checks whether or not that switch ID designated to be deleted is the switch ID that has been set in the placement information for display, and if not, the control part 2 performs the error processing in step S225 since the object to be deleted does not exist and then ends the process. If the presence of the switch ID is confirmed, then the control part 2 updates the placement information for display so as to delete this switch ID in step S243, thereby making the unnecessary switch image 50 to be not displayed.

If the received setting information contains the information of the switch placement change, then the control part 2 proceeds from step S250 to step S251, and acquires the information of the switch ID/area subjected to the placement change contained in the received information. For example, the information of the switch ID/area is the information of the switch ID changed to and the area to which that switch ID is designated to be placed. The control part 2 determines whether or not the placement change designated in step S251 is possible. That is, the change might be impossible if the area to which the switch ID is designated to be placed has been set for the fixed switch placement, for example. In case of the change impossible, the control part 2 performs the error processing in step S225 and ends the process. In case of the change possible, the control part 2 updates the placement information for display in step S253, specifically, updates so as to change the correspondence relationship between the switch ID and the area. By doing so, the placement of the switch images 50 to be presented can be changed.

If the received setting information contains the information of the background, then the control part 2 proceeds from step S260 to step S261, and acquires the background ID designated in the received information. In step S262, the control part 2 determines whether or not that background ID is not the current background ID and is the background ID which exists as other background image pattern. That is, the control part 2 checks whether or not that background ID is changeable. If that background ID is improper and the background is not changeable, then the control part 2 performs the error processing in step S225 in FIG. 12 and ends the process. If the background is changeable, the control part 2 updates the background setting in the displacement information for display, i.e., updates the associated background ID information, in step S263. By doing so, the background is changed.

If the received information contains information of horizontal (right-side-left) change, then the control part 2 proceeds from step S270 to step S271, and updates the placement information for display. Specifically, the correspondence relationships between the switch IDs and the areas are updated such that the placement of the switch images 50 to be placed is inverted horizontally. Accordingly, the placement change can be made according to the vehicle types of the right-hand steering wheel and the left-hand steering wheel, even if the horizontal information was not obtained from the vehicle during the initial placement setting.

6. Summary and Modified Examples

The touch panel switch device 1 according to the above-described embodiment provides the following advantageous effects. The touch panel switch device 1 of the above-described embodiment includes the touch panel 5 arranged to correspond to the display panel 4, and the storage part 10 which stores the switch image information according to the respective operation functions (i.e., the switch image table of FIG. 4A), the code information according to the respective operation functions (i.e., the switch function table of FIG. 4C) and the placement information for display designating the placement of the switch images to be displayed on the display panel 4 (refer to FIGS. 8A-8D and FIGS. 9A-9D). The touch panel switch device 1 further includes the control part 2 configured to display the switch images 50 on the display panel 4 according to the switch image information and the placement information for display and configured to, in accordance with the touch operation onto the touch panel 5, read out from the storage part 10 the code information corresponding to the switch images 50 displayed at the touch operated location, and controls output from the I/F part 3 (the process of FIG. 10). The control part 2 further performs the rewriting process of the placement information for display based on the received information (the processes of FIG. 11-FIG. 15). With the switch image information and the code information of the respective operation functions, the switches of various operation functions can be provided with various layouts by rewriting the placement information for display. For example, in the case of the use in the vehicle, the required switches can be provided in accordance with each of the automobiles which vary depending the vehicle models, grades, function types and options, by the common touch panel switch device. Further, since the various switches can be provided flexibly, there is no need to prepare different switch modules according to the vehicle models and grades, for example. Consequently, the efficiency of production process can be improved, the number of components as the switch module can be reduced, and the production cost of the vehicles can be reduced. Moreover, compared to the conventional mechanical switches, the spatial limitation is reduced for performing the required number of switching. Preferably, the code information to be stored is those codes used in the mounted apparatus. For example, by storing the code information that conform to the operation code system of a certain automobile manufacturer, the touch panel switch device when mounted on the vehicle during the production process of that automobile manufacturer can be used directly as the switch module compatible with this vehicle.

Moreover, in the embodiment described above, the storage part 10 stores, for each type of the mounted apparatus, the type correspondence table indicating the switch placement information designating the placement of the switch images 50 to be displayed on the display panel 4 (refer to FIG. 6), and, the control part 2 updates the placement information for display using the switch placement information read out from the type correspondence table in accordance with the receipt of the type information (refer to steps S203, S204, S207 and S208 of FIG. 8A, FIG. 8B and FIG. 11). By storing the type correspondence table in which the default switch placement information is stored, the initial switch placement setting according to the type (e.g., vehicle model and grade) of that mounted apparatus can be achieved by receiving the type information. Since the switch arrangement according to the automobile to be mounted can be made only by receiving the type information from the ECU and such of the vehicle in the process, the efficiency of the process can be improved. Moreover, the control part 2 can customize the switch functions by updating the placement information stored with the switch setting according to the mounted vehicle.

FIG. 6 shows the example in which the switch placement information is constituted of the layout ID and the switch-area correspondence information. However, this is only an example, and, when using the fixed layout (i.e., fixed area placement), the switch placement information may only contain the switch-area correspondence information, or may be information that indicates the switch IDs in a sequential order. In an alternative example, the touch panel switch device may not include the type correspondence table. In this case, the default ID and the switch placement information (i.e., the layout ID and the switch-area correspondence information) may be received from the ECU of the mounted vehicle or other computer device and such, and the switch setting may be performed based on that information.

In the embodiment described above, the control part 2 updates the placement information for display in accordance with the receipt of the right/left application information such that the placement of the switch images is designated to be for the right application or the left application (refer to steps S205-S208 in FIG. 8A, FIG. 8B and FIG. 11), thereby allowing to flexibly deal with the switch placement for the right application and the left application. Also, the switch placement information does not need to be stored separately for the right application and the left application. Thus, it is not necessary to expand the capacity for storing the type correspondence table to deal with the right/left applications, thereby achieving the efficient uses of the memory. Especially in the case of the use in the vehicle, the right/left application information indicates whether the vehicle as the mounted apparatus is the right-hand steering wheel vehicle or the left-hand steering wheel vehicle. For those switches for the operations of the functions related to various driving, the suitable switch placement may be opposite horizontally (i.e., in the right-left direction) depending on the right-hand steering wheel or the left-hand steering wheel. Thus, for the touch panel switch device to be mounted on the vehicle, it is significantly useful to automatically perform the placement setting according to the receipt of the information related to the right-hand steering wheel and the left-hand steering wheel. In the automobile manufacturing production, with the above-described touch panel switch device mounted, the suitable switch placement can be provided automatically regardless of the right-hand steering wheel or the left-hand steering wheel, allowing the use of the common touch panel switch device and saving the labor for dealing with the setting for the right/left applications. In the case of the vehicle, many vehicle models are produced for the right-hand steering wheel and the left-hand steering wheel, thus the effect of the reduction of the capacity of the type correspondence table is significant, and also, the versatility of the touch panel switch device 1 can be expanded.

In the embodiment described above, the storage part 10 stores the background table in which the plurality of background image patterns is stored (refer to FIG. 4B), and, the control part 2 is configured to display the background of the switch image 50 on the display panel 4 using the background image pattern designated by the background ID (step S209 of FIG. 11). Consequently, the switch device with the appearance matched with the location to be mounted can be provided. For example, the background can be switched to various background colors and textures such as wood-grain and metal in accordance with the color and the texture of the vehicle interior. Furthermore, since the background is selectable, there is no need to prepare separate switches having the background according to the body color and interior.

In the embodiment described above, the control part 2 updates the placement information for display in accordance with the receipt of the information of the switch addition, the switch placement change, the switch deletion or the layout change (FIG. 12 and FIG. 13). The display form can be changed as described above means that the arrangeable switch can be changed or the placement position of the switch can be changed. Consequently, the switch arrangement according to the user is possible, for example. Specifically, when adding the optional function as a car dealer option, the switch related to that function can be added easily. Moreover, if some functions are not to be used (e.g., if the corresponding device is removed), the related switch can be deleted easily to avoid providing unrequired switch.

In the embodiment described above, the control part 2 makes a request for transmission of the type information with respect to the mounted apparatus, and updates the placement information for display using the switch placement information read out from the type correspondence table in accordance with the receipt of the type information transmitted in response to the request (FIG. 14B, FIG. 11). For example, if the touch panel switch device 1 is mounted on the mounted apparatus such as the vehicle, and the control part 2 is configured to automatically make a request for transmission of the type information after it becomes communicable with the ECU by the CAN or LIN or the like, then the touch panel switch device can automatically perform the switch setting according to the mounted vehicle. Thus, it is possible to automatically provide the switch placement according to the type of that mounted apparatus (i.e., vehicle) after the touch panel switch device is mounted, thereby significantly improving the process efficiency.

Moreover, the touch panel switch device 1 of the above-described embodiment has following advantageous effects desirable for vehicles. Due to the multi-functionalization of an automobile, expansion of automatic driving/driving support functions and expansion of electronic control range and such, the required number of switches has been increasing, causing a difficulty in placing the mechanical switches. Also, addition and customizing of functions according to the individual user's needs are demanded more, and also there are many demands for switch replacement and such. With the touch panel switch device of the present invention, it is possible to provide the required number/kinds of switches much more efficiently compared to the mechanical switch. Moreover, the range of the so-called dealer options can be expanded.

Of course, the present invention can be applied as a touch panel switch device for apparatus other than vehicles. For example, the present invention may be applied to airplanes, ships or other moving bodies, machine tools, factory equipment, and controllers of wireless flight vehicles and such. Especially, the present invention is suitable for applications in which it is suitable to apply the horizontal (right-side-left) inversion to the switch placement (e.g., according to right/left position of an operator or according to whether an operator is right-handed or left-handed).

LIST OF REFERENCE SIGNS

1 touch panel switch device
2 control part

3 I/F part
4 display panel
5 touch panel
6 display driver
7 ROM
8 flash memory
9 RAM
10 storage part
50 switch image

What is claimed is:

1. A touch panel switch device comprising:
a display panel;
a touch panel placed correspondingly to the display panel;
a storage part which stores switch image information according to respective operation functions, code information according to the respective operation functions and placement information for display designating placement of switch images to be displayed on the display panel; and
a control part configured to
make the display panel to display the switch images according to the switch image information and the placement information for display,
in accordance with a touch operation onto the touch panel, read out from the storage part the code information corresponding to the switch image displayed at a location of the touch operation,
perform output control of the code information, and
also perform a rewrite process of the placement information for display based on received information, wherein
the storage part stores a type correspondence table indicating switch placement information designating placement of the switch images to be displayed on the display panel for each of types of a mounted apparatus on which the touch panel switch device is mounted, the switch placement information including:
a layout ID including layout information constituted of coordinate data indicative of a plurality of switch placement areas for the switch images; and
switch-area correspondence information designating which switch is placed to each switch placement area in the layout information designated by the layout ID, and
the control part is configured to update the placement information for display using the switch placement information read out from the type correspondence table, in accordance with receipt of type information.

2. The touch panel switch device according to claim 1, wherein
the control part is configured to make a request for transmission of the type information to the mounted apparatus, and to update the placement information for display using the switch placement information read out from the type correspondence table in accordance with receipt of the type information transmitted in response to the request.

3. The touch panel switch device according to claim 2, wherein
the right/left application information is information indicating whether a vehicle on which the touch panel switch device is mounted is a right-hand steering wheel vehicle or a left-hand steering wheel vehicle.

4. The touch panel switch device according to claim 1, wherein
the control part is configured to update the placement information for display based on receipt of right/left application information, such that the placement of the switch images is designated to be for a right application or for a left application.

5. The touch panel switch device according to claim 1, wherein
the storage part stores a background table in which a plurality of background image patterns is stored, and
the control part is configured to perform display of a background of the switch images on the display panel using the background image pattern designated by a background designating information.

6. The touch panel switch device according to claim 1, wherein
the control part updates the placement information for display in accordance with receipt of information of switch addition, switch placement change, switch deletion or layout change.

* * * * *